US009225300B2

(12) United States Patent
Jones et al.

(10) Patent No.: US 9,225,300 B2
(45) Date of Patent: Dec. 29, 2015

(54) CONFIGURABLE POWER AMPLIFIER AND RELATED CONSTRUCTION METHOD

(71) Applicants: Jeffrey K. Jones, Chandler, AZ (US); Robert A. Pryor, Mesa, AZ (US); Joseph G. Schultz, Wheaton, IL (US)

(72) Inventors: Jeffrey K. Jones, Chandler, AZ (US); Robert A. Pryor, Mesa, AZ (US); Joseph G. Schultz, Wheaton, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 36 days.

(21) Appl. No.: 14/265,849

(22) Filed: Apr. 30, 2014

(65) Prior Publication Data

US 2015/0318832 A1    Nov. 5, 2015

(51) Int. Cl.
| | |
|---|---|
| *H03F 1/56* | (2006.01) |
| *H03F 3/19* | (2006.01) |
| *H03F 3/21* | (2006.01) |
| *H03F 3/191* | (2006.01) |

(52) U.S. Cl.
CPC .. *H03F 1/56* (2013.01); *H03F 3/19* (2013.01); *H03F 3/191* (2013.01); *H03F 3/211* (2013.01); *H03F 2200/222* (2013.01); *H03F 2200/451* (2013.01)

(58) Field of Classification Search
CPC .................................. H03F 3/68; H03F 3/191
USPC ....................................... 330/124 R, 295, 302
See application file for complete search history.

(56) References Cited

U.S. PATENT DOCUMENTS

| | | | | |
|---|---|---|---|---|
| 7,362,171 | B2 * | 4/2008 | Kunihiro | 330/126 |
| 2012/0182084 | A1 * | 7/2012 | Peng et al. | 333/100 |
| 2013/0316663 | A1 * | 11/2013 | Kishigami et al. | 455/78 |
| 2014/0292414 | A1 * | 10/2014 | Vice | 330/295 |

OTHER PUBLICATIONS

"NXP Introduces an Innovative MMICs Family" NXP Semiconductors Powerpoint Presentation, Jun. 6, 2013, pp. 1-16.

* cited by examiner

*Primary Examiner* — Steven J Mottola

(57) ABSTRACT

A multiple-path, configurable, radio-frequency (RF) circuit is provided, including: a first amplifier path amplify a first RF signal to generate a first amplified signal; a second amplifier path configured to amplify a second RF signal to generate a second amplified signal; a corrective input matching circuit, configured to change first input-impedance-matching properties of the first amplifier path, and to change second input-impedance-matching properties of the second amplifier path; a first isolation element configured to selectively ground an input node of the second amplifier path; a second isolation element configured to selectively ground an output node of the second amplifier path; and a third isolation element connected between the first and second amplifier paths, configured to selectively isolate the corrective input matching circuit from first and second input nodes of the first and second amplifier paths, respectively, or connect the corrective input matching circuit to the first and second input nodes.

20 Claims, 8 Drawing Sheets

CONFIGURABLE POWER AMPLIFIER AND RELATED CONSTRUCTION METHOD

FIELD OF THE INVENTION

The present invention relates to power amplifiers. More particularly, the present invention relates to a configurable power amplifier that provides multiple possible amplification factors in a single-die amplifier circuit.

BACKGROUND OF THE INVENTION

Many modern devices employ radio frequency (RF) devices or integrated circuits (ICs), such as RF power devices, to transmit signals through the air. Such RF devices often have two or more input/output paths. For example, one input signal might be amplified by two or more different amplification factors to produce two or more separate output signals; two or more input signals might be separately amplified (by the same or a different application factor), and added together to produce a single output signal; or some combination of two or more signals could be amplified (by the same or a different application factor), and combined in some fashion to generate two or more output signals.

When a device has multiple amplification paths, it is generally preferable that they have fundamental characteristics (e.g., $V_{th}$, gate length, $C_{ds}$, $C_{gs}$, passive matching elements, etc.) that are as close to identical as possible. This typically means that the two paths must be fabricated on the same wafer die. Since many different variations of implication paths are required for the variety of devices manufactured, it is generally necessary to manufacture a wide variety of dies, each including one particular implementation (i.e., one particular set of multiple paths).

For example, one device might need two amplification paths, each providing 7.5 W of amplification; another device might need two application paths, one providing 7.5 W of amplification and the other providing 15 W of amplification; and another device might require two amplification paths each providing 15 W amplification. A manufacturer looking to manufacture these three devices would have to design and produce three separate die blocks, each with its own inherent design, testing, and production requirement. Making all of these individual die blocks, with all of the required variations of multiple implementations, is expensive and time-consuming.

Furthermore, when wafers are designed with "paired" dies of different power levels, probe and yield issues can arise. In addition, multi-path RF devices require sufficient isolation between the multiple paths so that drive charges on one path will cause only minimal changes to adjacent or nearby paths.

It would therefore be desirable to provide a single, configurable multipath die block that allows a single die, provided in a single RF package, to be used in multiple power/architecture arrangements.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Much of the inventive functionality and many of the inventive principles when implemented, may be supported with or in integrated circuits (ICs, or the like). In particular, they may be implemented using CMOS transistors. It is expected that one of ordinary skill, notwithstanding possibly significant effort and many design choices motivated by, for example, available time, current technology, and economic considerations, when guided by the concepts and principles disclosed herein will be readily capable of generating such ICs with minimal experimentation. Therefore, in the interest of brevity and minimization of any risk of obscuring the principles and concepts according to the present invention, further discussion of such ICs will be limited to the essentials with respect to the principles and concepts used by the exemplary embodiments.

Single-Die RF Amplifier

Figure 1:
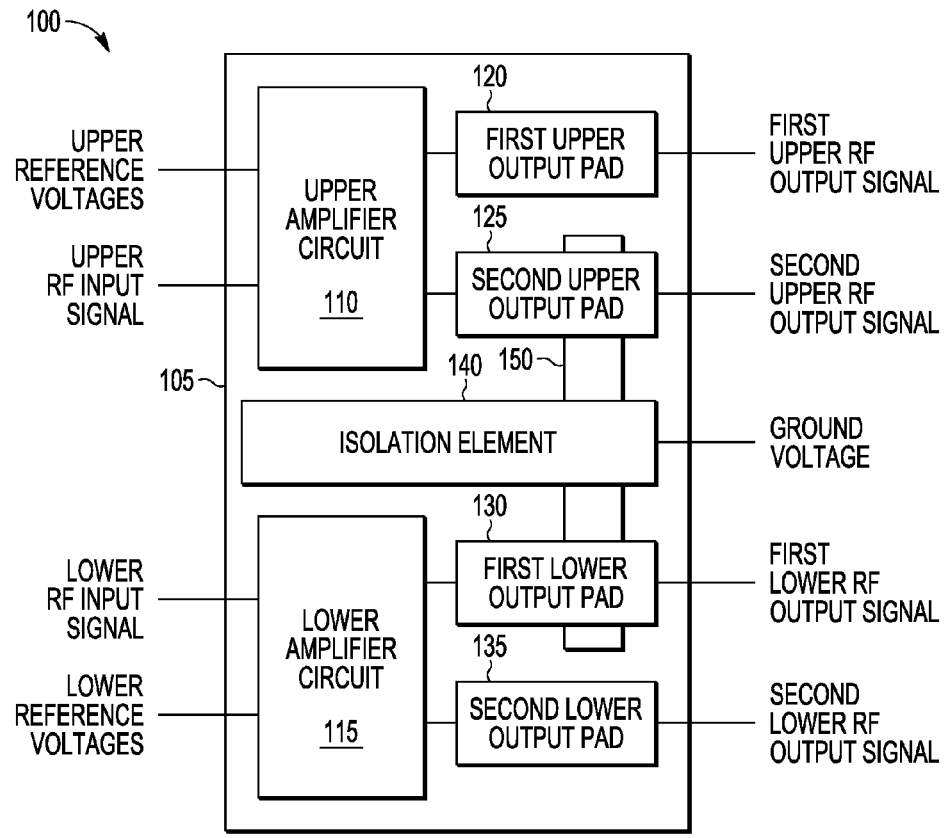
FIG. 1 is a block diagram of an RF amplifier according to disclosed embodiments.

FIG. 1 is a block diagram of an RF amplifier 100 according to disclosed embodiments. As shown in FIG. 1, the RF amplifier 100 is formed on a single die 105, and includes an upper amplifier circuit 110, a lower amplifier circuit 115, a first upper output pad 120, a second upper output pad 125, a first lower output pad 130, a second lower output pad 135, an isolation element 140, and a ground plane 150.

The upper amplifier circuit 110 receives an upper RF input signal and upper reference voltages, and passes the upper RF input signal through two amplifier paths to produce first and second upper amplifier outputs, which are provided to the first upper output pad 120 and the second upper output pad 125, respectively.

The lower amplifier circuit 115 receives a lower RF input signal and lower reference voltages, and passes the lower RF input signal through two amplifier paths to produce first and second lower amplifier outputs, which are provided to the first lower output pad 130 and the second lower output pad 135, respectively.

The first upper output pad 120 provides for a connection from the first upper amplifier output to outside of the single die 105, while the second upper output pad 125 provides a connection from the second upper amplifier output to outside of the single die 105.

Similarly, the first lower output pad 130 provides for a connection from the first lower amplifier output to outside of the single die 105, while the second lower output pad 135 provides a connection from the second lower amplifier output to outside of the single die 105.

The isolation element 140 serves to electrically isolate the upper amplifier circuit 110, along with the first and second upper output pads 120, 125, from the lower amplifier circuit 115 and the first and second lower output pads 130, 135. In some embodiments, the isolation element 140 can be a grounding element formed between the upper and lower amplifier circuits 110, 115. More particularly, in some embodiments the isolation element 140 can be a ground fence region.

The ground plane 150 provides for a ground voltage on the single die 105. It is located adjacent to the isolation element 140 to allow the isolation element to be connected to ground. The ground plane 150 is also located adjacent to the upper output pad 125 and the first lower output pad 130. This allows both the second upper output pad 125 and the first lower output pad 132 easily be grounded in various configurations.

Figure 2:
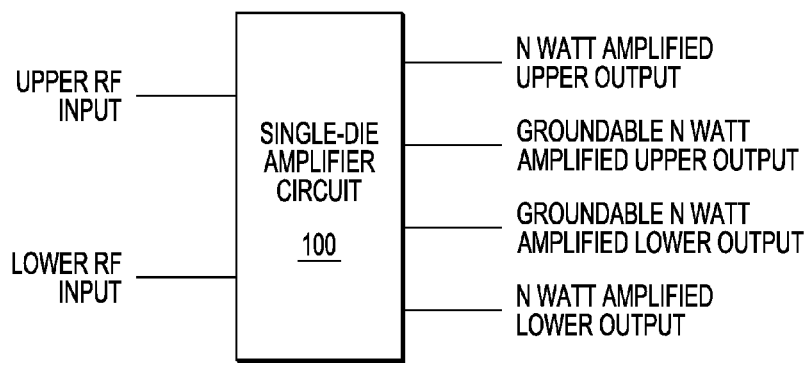
FIG. 2 is a simplified block diagram of the RF amplifier of FIG. 1 according to disclosed embodiments.

FIG. 2 is a simplified block diagram of the RF amplifier 100 of FIG. 1 according to disclosed embodiments. As shown in FIG. 2, the single-die amplifier circuit 100 includes an upper RF input and a lower RF input signal at which it receives upper and lower RF input signals, and includes an N-watt amplified upper output, a groundable N-watt amplified upper output, a groundable N-watt amplified lower output, and an N-watt amplified lower output, at which it can be provided a variety of amplified output signals by the single-die amplifier circuit 100. Indications of the upper and lower reference voltages and the ground voltage are omitted from this drawing for the purposes of simplicity, although these voltages are still provided to the single-die amplifier circuit 100.

Figure 3:
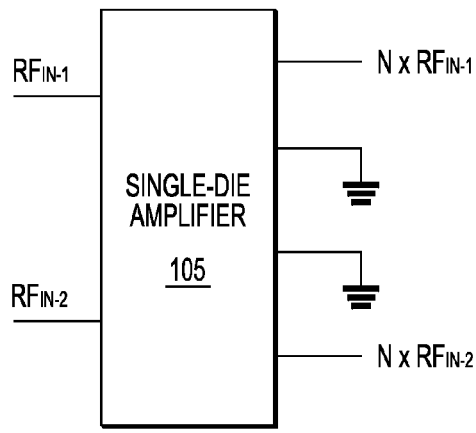
FIG. 3 is a block diagram showing a first configuration of the RF amplifier of FIG. 1 according to disclosed embodiments.
Figure 4:
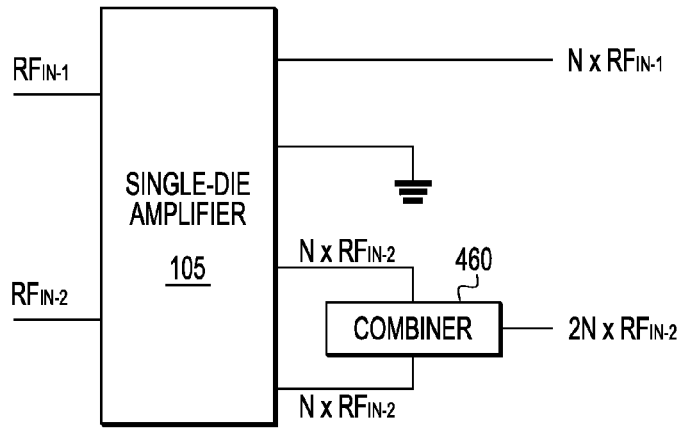
FIG. 4 is a block diagram showing a second configuration of the RF amplifier of FIG. 1 according to disclosed embodiments.
Figure 5:
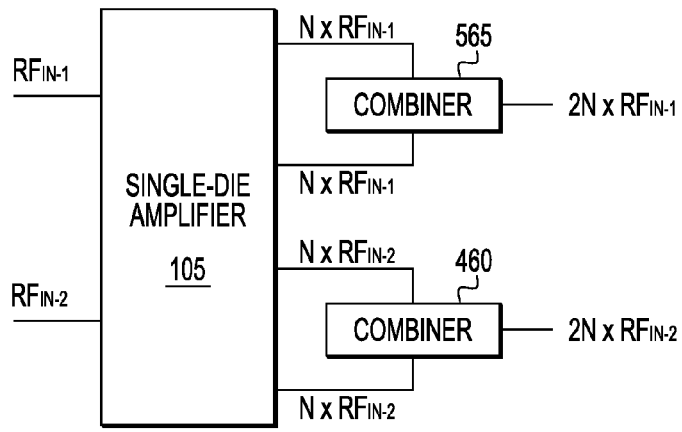
FIG. 5 is a block diagram showing a third configuration of the RF amplifier of FIG. 1 according to disclosed embodiments.

The RF amplifier 100 of FIG. 1 can be configured in a number of ways to provide different amplifications of the upper and lower RF input signals FIGS. 3-5 show three possible configurations.

FIG. 3 is a block diagram showing a first configuration of the RF amplifier 100 of FIG. 1 according to disclosed embodiments. As shown in FIG. 3, in this first configuration, both the groundable N-watt amplified upper output and the groundable N-watt amplified lower output are connected to ground.

An upper RF input signal $RF_{IN-1}$ is amplified by a factor of N to provide a first amplified output signal of $(N \times RF_{IN-1})$ at the N-watt amplified upper output. Similarly, a lower RF input signal $RF_{IN-2}$ is also amplified by a factor of N to provide a second amplified output signal of $(N \times RF_{IN-2})$ at the N-watt amplified lower output. In this way, the RF amplifier 100 amplifies both the upper and lower RF input signals, $RF_{IN-1}$ and $RF_{IN-2}$, by a factor of N.

In this way, two amplified output signals (the first and second amplified output signals) are provided that have the same degree of amplification. For example, in one embodiment N can be 7.5 W. In this case, the upper RF input signal is amplified by 7.5 W to generate the first amplified output signal, and the lower RF input signal is also amplified by 7.5 W to generate the second amplified output signal.

FIG. 4 is a block diagram showing a second configuration of the RF amplifier 100 of FIG. 1 according to disclosed embodiments. As shown in FIG. 4, in this second configuration, only the groundable N-watt amplified upper output is connected to ground.

The upper RF input signal $RF_{IN-1}$, provided at the upper RF input, is amplified by a factor of N to provide a first amplified output signal of $(N \times RF_{IN-1})$ at the N-watt amplified upper output, and the lower RF input signal $RF_{IN-2}$, provided at the lower RF input, is amplified by a factor of N to provide a second amplified output signal of $(N \times RF_{IN-2})$ at the N-watt amplified lower output, just as in the first configuration. In addition, the lower RF input signal $RF_{IN-2}$ is again amplified by a factor of N to provide a third amplified output signal of $(N \times RF_{IN-2})$ at the groundable N-watt amplified lower output.

The second and third amplified output signals are then provided to a first combiner 460, which combines the two signals such that they provide a first combined output signal of $(2N \times RF_{IN-2})$ at the output of the first combiner 460.

In this way, two amplified output signals (the first amplified output signal and the first combined output signal) are provided such that the first combined output signal has twice the amplification of the first amplified output signal. For example, in one embodiment N can be 7.5 W. In this case, the upper RF input signal is amplified by 7.5 W to generate the first amplified output signal, and the lower RF input signal is also amplified by 7.5 W twice to generate the second amplified output signal and the third amplified output signal. The second and third amplified output signals are then combined to form the first combined output signal, which is equal to the lower RF input signal amplified by 15 W.

FIG. 5 is a block diagram showing a third configuration of the RF amplifier 100 of FIG. 1 according to disclosed embodiments. As shown in FIG. 5, in this third configuration neither the groundable N-watt amplified upper output nor the groundable N-watt amplified lower output is connected to ground.

The upper RF input signal $RF_{IN-1}$, provided at the upper RF input, is amplified by a factor of N to provide a first amplified output signal of $(N \times RF_{IN-1})$ at the N-watt amplified upper output, and the lower RF input signal $RF_{IN-2}$, provided at the lower RF input, is amplified by a factor of N twice to provide second and third amplified output signals of $(N \times RF_{IN-2})$ at the N-watt amplified lower output and the groundable N-watt amplified lower output, respectively, just as in the second configuration. In addition, the upper RF input signal $RF_{IN-1}$ is again amplified by a factor of N to provide a fourth amplified output signal of $(N \times RF_{IN-1})$ at the groundable N-watt amplified upper output.

The second and third amplified output signals are then provided to a first combiner 460, which combines the two signals such that they provide a first combined output signal of $(2N \times RF_{IN-2})$ at the output of the first combiner 460. Likewise, the first and fourth amplified output signals are provided to a second combiner 565, which combines the two signals such that they provide a second combined output signal of $(2N \times RF_{IN-1})$ at the output of the second combiner 565.

In this way, two amplified output signals (the first and second combined output signals) are provided such that the first and second combined output signals have the same amplification. However, in this case the amplification is twice that of the two outputs of the first configuration. For example, in one embodiment N can be 7.5 W. In this case, the upper RF input signal is amplified by 7.5 W twice to generate the first and fourth amplified output signals, and the lower RF input signal is also amplified by 7.5 W twice to generate the second and third amplified output signals. The first and fourth amplified output signals are then combined to form the second combined output signal, which is equal to the upper RF input signal amplified by 15 W. Similarly, the second and third amplified output signals are combined to form the first combined output signal, which is equal to the lower RF input signal amplified by 15 W. Both inputs are therefore edified by 15 W, which is twice the 7.5 W of the first configuration.

By providing a single-die circuit that can be configured in at least the three configurations shown above, the disclosed amplifier design provides for greater flexibility with a single circuit. This same single-die circuit can be used in multiple devices that require differing applications. For example, one copy of this amplifier 100 could be used in a device that requires 7.5 W/7.5 W amplification, another copy could be used in a device that requires 7.5 W/15 W amplification, while a third copy could be used in a device that requires 15 W/15 W amplification. All three devices can be accommodated, but only a single, configurable amplification circuit needs to be designed and manufactured. All that is necessary is for the circuit to be properly configured for whatever implementation it will be used with.

Although FIGS. 3-5 show that each amplification path amplifies by the same factor N, this is by way of example only. Alternate embodiments could have different amplification factors in each of the amplification paths. For example the four disclosed pads could be an N watt amplified upper output, a groundable O watt amplified upper output, a groundable P watt amplified lower output, and a Q watt amplified lower output, where N, O, P, and Q may be different amplification factors.

Configurable RF Amplifier

Figure 6:
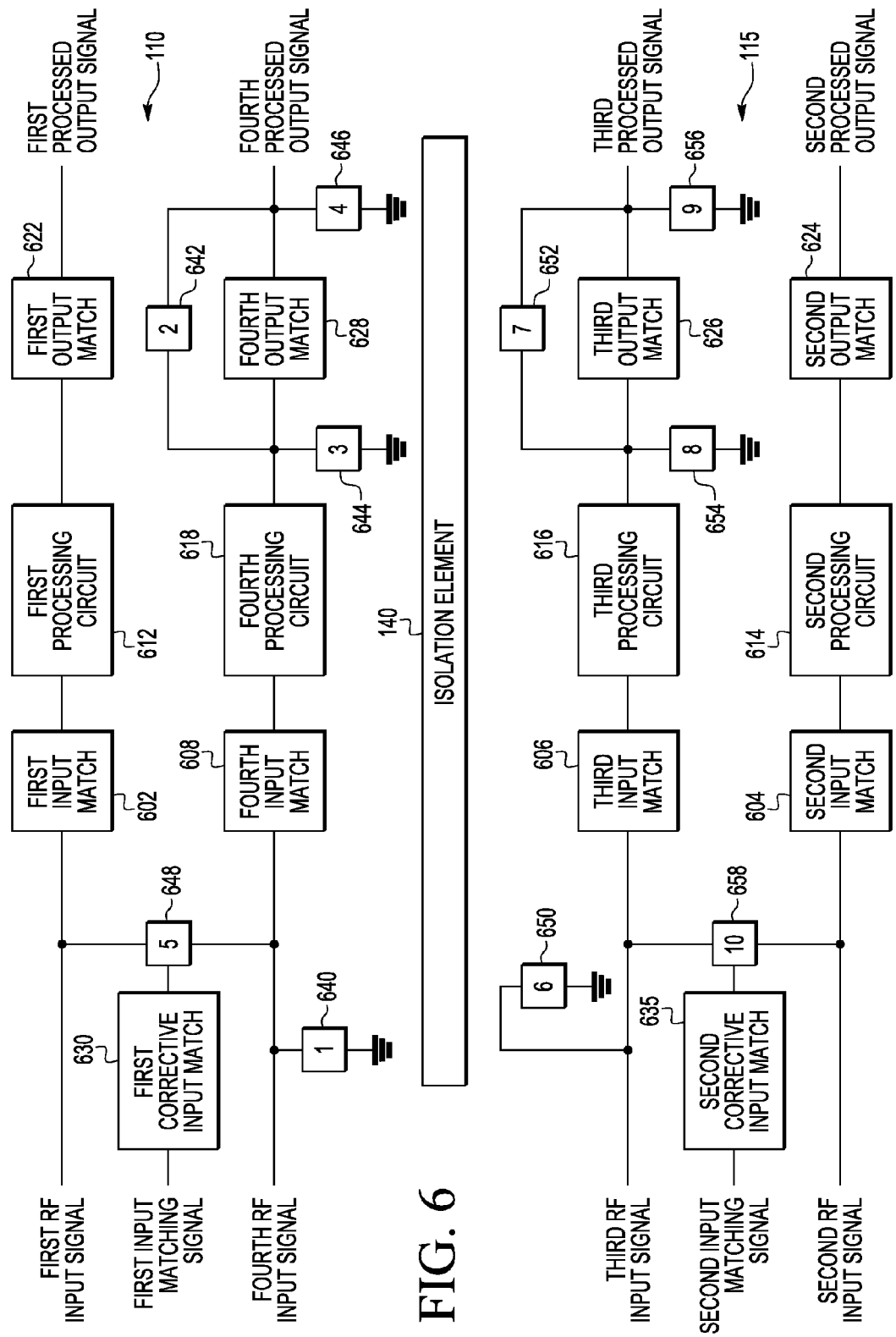
FIG. 6 is a block diagram showing the layout of configurable upper and lower amplifying circuits on a single die according to disclosed embodiments.

FIG. 6 is a block diagram showing the layout of configurable upper and lower amplifying circuits 110, 115 on a single die according to disclosed embodiments. The upper and lower amplifying circuits 110, 115 are separated by an isolation element 140. As shown in FIG. 6, the upper amplifying circuit 110 includes a first input matching circuit 602, a fourth input matching circuit 608, a first processing circuit 612, a fourth processing circuit 618, a first output matching circuit 622, a fourth output matching circuit 628, a first corrective input matching circuit 630, and first through fifth shortable electrical connections 640, 642, 644, 646, 648. Likewise, the lower amplifying circuit 115 includes a second input matching circuit 604, a third input matching circuit 606, a second processing circuit 614, a third processing circuit 616, a second output matching circuit 624, a third output matching circuit 626, a second corrective input matching circuit 635, and sixth through tenth shortable electrical connections 650, 652, 654, 656, 658.

The elements in the first configurable amplifier circuit 110 are generally arranged into first and fourth amplifier paths with the first corrective input matching circuit 630 in between the two paths. The first amplifier path includes the first input matching circuit 602, the first processing circuit 612, and the first output matching circuit 622; and the fourth amplifier path includes the fourth input matching circuit 608, the fourth processing circuit 618, and the fourth output matching circuit 628. The first through fifth shortable electrical connections 640, 642, 644, 646, 648 are arranged such that the fourth amplifier path can be connected or grounded out, as needed, and the first corrective input matching circuit 630 can be connected or isolated, as needed.

Similarly the elements in the second configurable amplifier circuit 115 are generally arranged into second and third amplifier paths with the second corrective input matching circuit 635 in between the two paths. The second amplifier path includes the second input matching circuit 604, the second processing circuit 614, and the second output matching circuit 624; and the third amplifier path includes the third input matching circuit 606, the third processing circuit 616, and the third output matching circuit 626. The sixth through tenth shortable electrical connections 650, 652, 654, 656, 658 are arranged such that the third amplifier path can be connected or grounded out, as needed, and the second corrective input matching circuit 635 can be connected or isolated, as needed.

For the purposes of the discussion of FIGS. 6-9, it is assumed that a first common input signal is provided as the second and third RF input signals, and a second common input signal is provided as the first and fourth RF input signals. However, this is by way of example only. In alternate embodiments different signals can be provided as the first through fourth RF input signals.

The first through fourth input matching circuits 602, 604, 606, 608 operate to properly change the input-impedance-matching properties at the input of a respective processing circuit 612, 614, 616, 618 (i.e., they match the impedance at the inputs). This impedance matching is done based on the assumption that only a single amplifier path is being used. If both amplifier paths are being used, there will be a different input impedance that must be matched.

The first through fourth processing circuits 612, 614, 616, 618 operate to provide all necessary processing to a respective RF input signal. In the disclosed embodiments, the first through fourth processing circuits 612, 614, 616, 618 are amplifier circuits that amplify the RF input signal by a set amount. In some embodiments, the first through fourth processing circuits 612, 614, 616, 618 can provide the same amplification (e.g., all providing 7.5 W of amplification). However, alternate embodiments could vary this and have the various processing circuits 612, 614, 616, 618 have differing amplification factors.

The first through fourth output matching circuits 622, 624, 626, 628 operate to properly change the output-impedance matching properties at the output of a respective processing circuit 612, 614, 616, 618 (i.e., match the impedance at the outputs).

The first and second corrective input matching circuits 630, 635 operate to match the impedance of the upper and lower amplifier circuits 110, 115 when both amplifier paths are being used. The first corrective input matching circuit 630 is configured such that, in conjunction with the first input matching circuit 602 and the fourth input matching circuit 608, it will correctly match the input impedance when both the first and fourth input paths are being used. Likewise, the second corrective input matching circuit 635 is configured such that, in conjunction with the second input matching circuit 604 and the third input matching circuit 606, it will correctly match the input impedance when both the second and third input paths are being used.

The first through tenth shortable electrical connections 640, 642, 644, 646, 648, 650, 652, 654, 656, 658 are electrical connections that can be selectively shorted out after the 105 die is manufactured. In some embodiments they may be low-inductance wire-bond jumpers. However, alternate embodiments can employ any other design that allows for a selectively shortable electrical connection that can be shorted after die manufacture.

The first through tenth shortable electrical connections 640, 642, 644, 646, 648, 650, 652, 654, 656, 658 can be considered isolation elements, since they can selectively isolate portions of the disclosed circuit. In addition, the second, third, and fourth shortable electrical connections 642, 644, 646 can collectively be considered a single isolation element, since they should either all be shorted or all the unshorted. Likewise the seventh, eighth, and ninth shortable electrical connections 652, 654, 656 can also collectively be considered a single isolation element, since they also should either all be shorted or all the unshorted.

The first shortable connection 640 is connected between the input of the fourth input matching circuit 608 and ground. If the first shortable connection 640 is shorted, it grounds out the input of the fourth input matching circuit 608, and the second RF input signal, which is provided to the input of the fourth input matching circuit 608. In this state, shortable connections 642, 644, and 646 should also be shorted, which disables the entire fourth path, and makes it a ground-only path to improve isolation. If the first shortable connection 640 remains unshorted, the fourth input matching circuit 608 receives the second RF input signal, matches its input impedance, and passes the second RF input signal to the input of the fourth processing circuit 618. In this state, shortable connections 642, 644, and 646 should also remain unshorted, to allow the signal to pass all the way through from the input of the fourth path to the output of the fourth path.

The second shortable connection 642 is connected in parallel with the fourth output matching circuit 628. If the second shortable connection 642 is shorted, the line from the input to the output of the fourth output matching circuit 628 will bypass the fourth output matching circuit 628, causing the output of the fourth processing circuit 618 to likewise bypass the fourth output matching circuit 628. If the second shortable connection 642 is unshorted, the fourth output matching circuit will receive the output of the fourth processing circuit 618, match its output impedance, and supply the impedance-matched output as a fourth processed output signal.

The third shortable connection is connected between the input of the fourth output matching circuit 628 and ground. If the third shortable connection 644 is unshorted, the input of the fourth output matching circuit 628 will be grounded, and will not receive the output of the fourth processing circuit 618. If the third shortable connection 644 is shorted, the input of the fourth output matching circuit 628 will receive the output of the fourth processing circuit 618.

The fourth shortable connection 646 is connected between the output of the fourth output matching circuit 628 and ground. If the fourth shortable connection 646 is unshorted, the output of the fourth output matching circuit 628 will be grounded, and it will provide only a ground voltage as the fourth processed output signal. If the fourth shortable connection 646 is shorted, the output of the fourth output matching circuit 628 will operate normally.

The second through fourth shortable connections 642, 644, 646 are either all shorted or all unshorted. If they are all shorted, then the fourth output matching circuit 628 operates to pass the output of the fourth processing circuit 618, while matching the output impedance for the lower path in the first configurable amplifier circuit 110. If they are all unshorted, then the fourth output matching circuit 628 is completely bypassed, and the output of the fourth processing circuit 618 is grounded. In this case, since the fourth output matching circuit 628 is completely bypassed, the impedance matching circuitry in the fourth output matching circuit 628 will have no effect on the fourth processed output signal.

The fifth shortable connection 648 is connected between the first amplifying path, the fourth amplifying path, and the output of the first corrective input matching circuit 630. If the fifth shortable connection 648 is unshorted, then the first corrective input matching circuit 630 is connected to the first amplifier path at the input of the first impedance matching circuit 602, and is connected to the fourth amplifier path at the input of the fourth input matching circuit 608. Thus, the fifth shortable connection 648 is similar to a double pole/single throw switch. In this case, the first corrective input matching circuit 630, together with the first and fourth input matching circuits 602, 608 provides proper impedance matching for when both the first and fourth amplifier paths in the upper configurable amplifier circuit 110 are being used.

If one implementation of the fifth shortable connection 648 is shorted, however, the first corrective input matching circuit 630 will be isolated from both the upper and lower amplifier paths. In this case, the first input matching circuit 602 will operate to match the impedance at the input of the first processing circuit 612, while the fourth input matching circuit 608 will operate to match the impedance at the input of the fourth processing circuit 618.

In the configurable amplifier circuit 100 of FIG. 6, of the first through fourth shortable connections 640, 642, 644, 646 are all either shorted or left unshorted as a group. Furthermore, the fifth shortable connection 648 has a status opposite that of the first through fourth shortable connections 640, 642, 644, 646. In other words, when the first through fourth shortable connections 640, 642, 644, 646 are shorted, the fifth shortable connection 648 is unshorted. Likewise, when the first through fourth shortable connections 640, 642, 644, 646 are unshorted, the fifth shortable connection 648 is shorted.

The sixth shortable connection 650 is connected between the input of the third input matching circuit 606 and ground. If the sixth shortable connection 650 is shorted, it grounds out the input of the third input matching circuit 606, and the third RF input signal, which is provided to the input of the third input matching circuit 606. In this state, shortable connections 652, 654, and 656 should also be shorted, which disables the entire second path, and makes it a ground-only path to improve isolation. If the sixth shortable connection 650 remains unshorted, the third input matching circuit 606 receives the third RF input signal, matches its input impedance, and passes the third RF input signal to the input of the third processing circuit 616. In this state, shortable connections 652, 654, and 656 should also remain unshorted, to allow the signal to pass all the way through from the input of the second path to the output of the second path.

The seventh shortable connection 652 is connected in parallel with the third output matching circuit 626. If the seventh shortable connection 652 is unshorted, the line from the input to the output of the third output matching circuit 626 will bypass the third output matching circuit 626, causing the output of the third processing circuit 616 to likewise bypass the third output matching circuit 626. If the seventh shortable connection 652 is shorted, the third output matching circuit 626 will receive the output of the third processing circuit 616, match its output impedance, and supply the impedance-matched output as a third processed output signal.

The eighth shortable connection 654 is connected between the input of the third output matching circuit 626 and ground. If the eighth shortable connection 654 is unshorted, the input of the third output matching circuit 626 will be grounded, and will not receive the output of the third processing circuit 616. If the eighth shortable connection 654 is shorted, the input of the third output matching circuit 626 will receive the output of the third processing circuit 616.

The ninth shortable connection 656 is connected between the output of the third output matching circuit 626 and ground. If the ninth shortable connection 656 is unshorted, the output of the third output matching circuit 626 will be grounded, and it will provide only a ground voltage as the third processed output signal. If the ninth shortable connection 656 is shorted, the output of the third output matching circuit 626 will operate normally.

The seventh through ninth shortable connections 652, 654, 656 are either all shorted or all unshorted. If they are all shorted, then the third output matching circuit 626 operates to pass the output of the third processing circuit 616, while matching the output impedance for the upper path in the second configurable amplifier circuit 115. If they are all unshorted, then the third output matching circuit 626 is completely bypassed, and the output of the third processing circuit 616 is grounded. In this case, since the fourth output matching circuit 626 is completely bypassed, the impedance matching circuitry in the third output matching circuit 626 will have no effect on the third processed output signal.

The tenth shortable connection 658 is connected between the second amplifying path, the third amplifying path, and the output of the second corrective input matching circuit 635. If the tenth shortable connection 658 is unshorted, then the second corrective input matching circuit 635 is connected to the third amplifier path of the lower configurable amplifier circuit 115 at the input of the third impedance matching circuit 606, and is connected to the second amplifier path of the second configurable amplifier circuit 115 at the input of the second input matching circuit 604. Thus, the tenth shortable connection 658 is similar to a double pole/single throw switch. In this case, the second corrective input matching circuit 635, together with the second and third input matching circuits 604, 606 provides proper impedance matching for when both the second and third amplifier paths of the lower configurable amplifier circuit 115 are being used.

If the tenth shortable connection 648 is shorted, however, the second corrective input matching circuit 635 will be isolated from both the upper and lower amplifier paths of the second configurable amplifier circuit 115. In this case, the second input matching circuit 604 will operate to match the impedance at the input of the second processing circuit 614, while the third input matching circuit 606 will operate to match the impedance at the input of the third processing circuit 616.

In one implementation of the second configurable amplifier circuit 115 of FIG. 6, of the sixth through tenth shortable connections 650, 652, 654, 656, 658 are all either shorted or left unshorted as a group. Furthermore, the tenth shortable connection 658 has a status opposite that of the sixth through ninth shortable connections 650, 652, 654, 656. In other words, when the sixth through ninth shortable connections 650, 652, 654, 656 are shorted, the tenth shortable connection 658 is unshorted. Likewise, when the sixth through ninth shortable connections 650, 652, 654, 656 are unshorted, the tenth shortable connection 658 is shorted.

Figure 7:
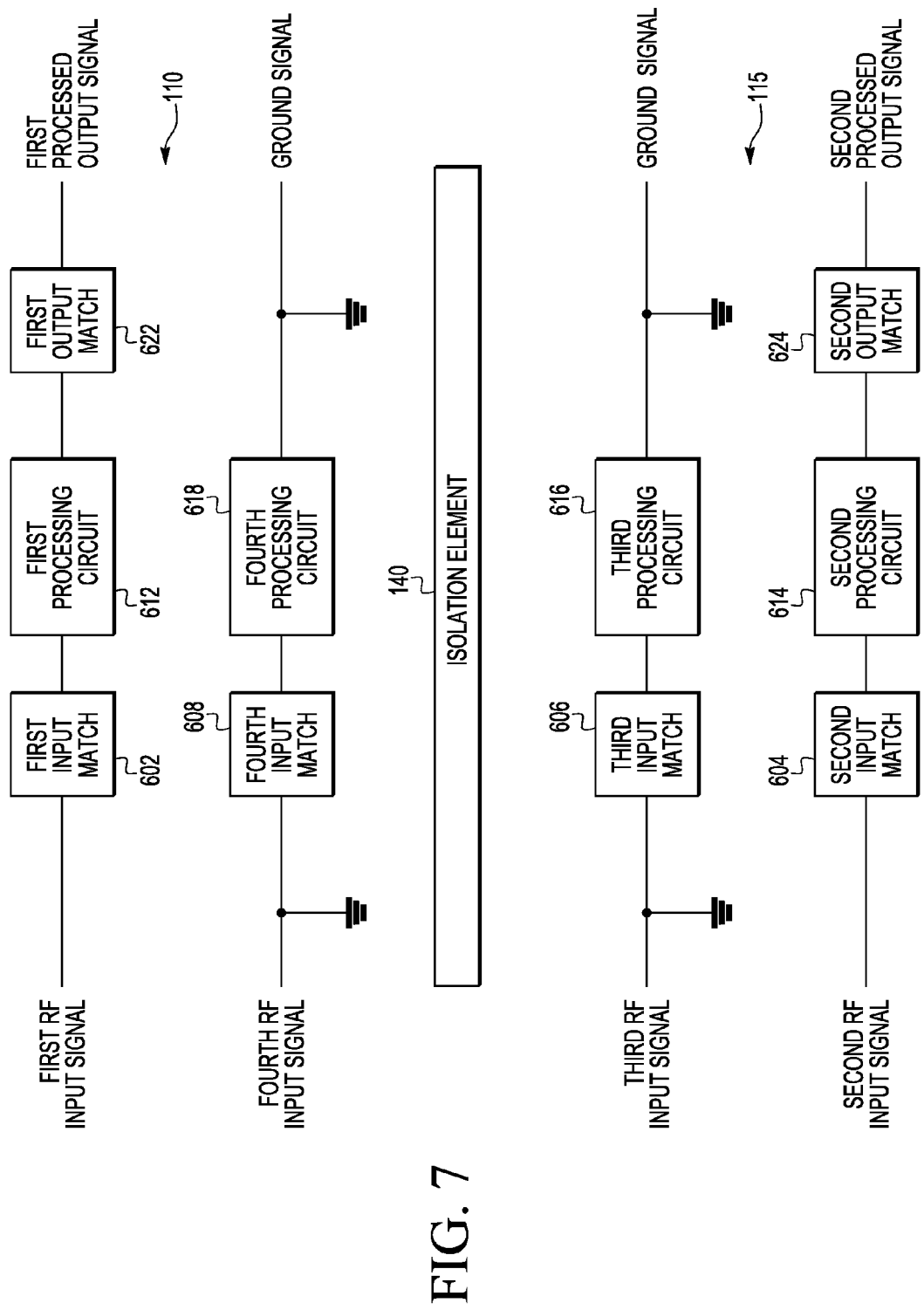
FIG. 7 is a block diagram showing a first configuration of the layout of FIG. 6 according to disclosed embodiments.
Figure 8:
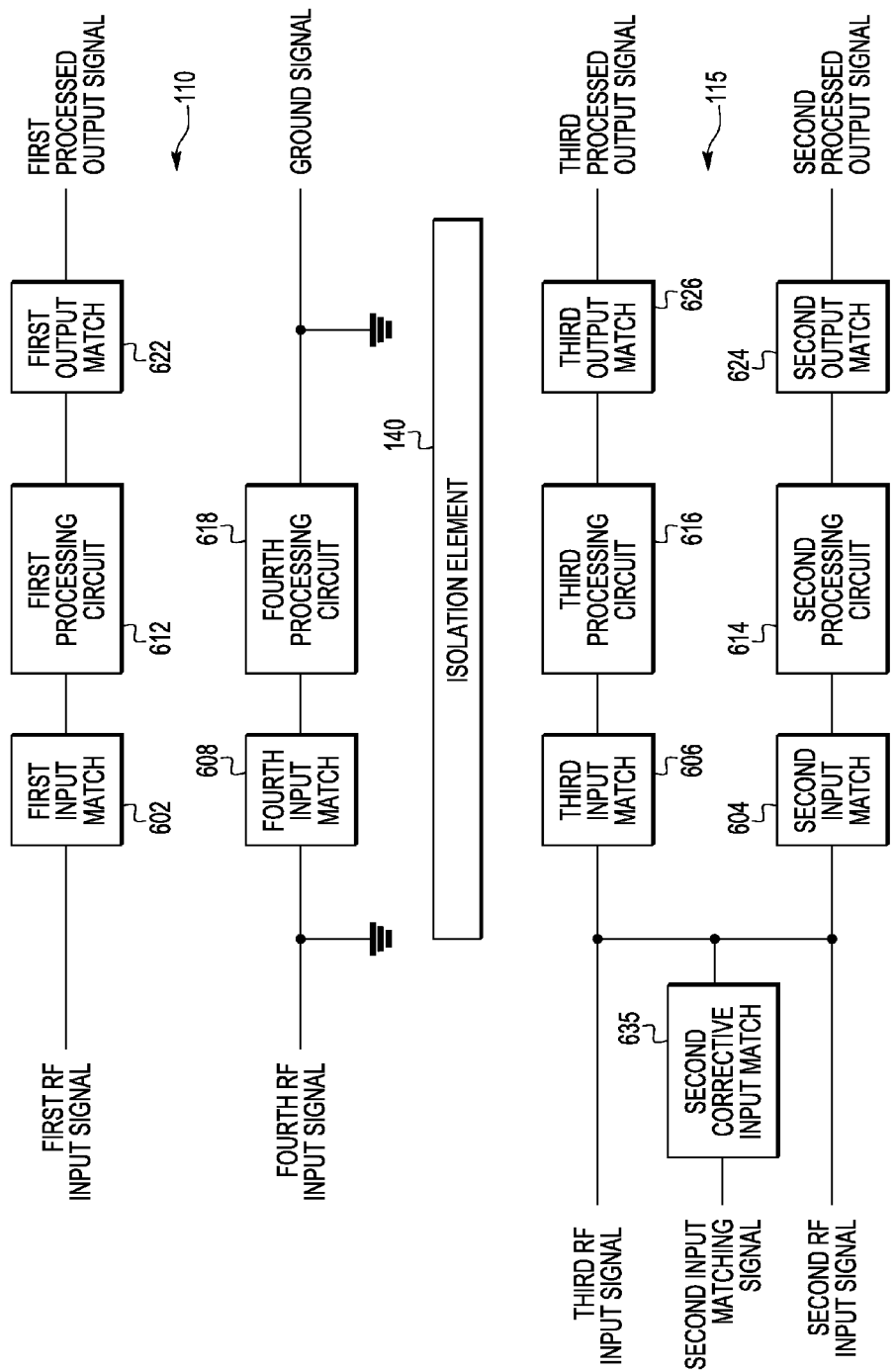
FIG. 8 is a block diagram showing a second configuration of the layout of FIG. 6 according to disclosed embodiments.
Figure 9:
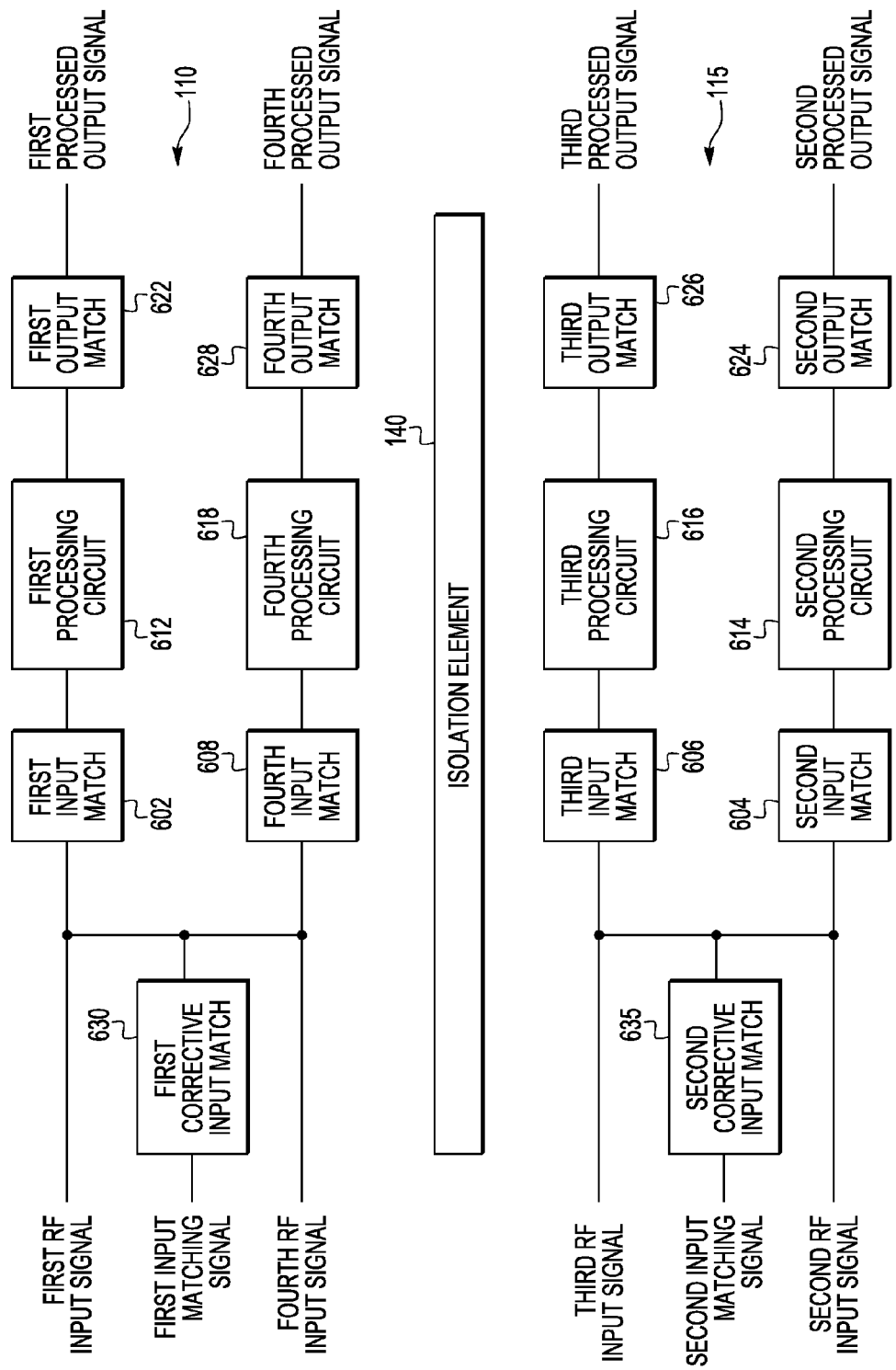
FIG. 9 is a block diagram showing a third configuration of the layout of FIG. 6 according to disclosed embodiments.

FIGS. 7-9 are block diagrams showing three possible configurations of the amplifier 100 of FIG. 6. FIG. 7 is a block diagram showing a first configuration of the layout of FIG. 6 according to disclosed embodiments; FIG. 8 is a block diagram showing a second configuration of the layout of FIG. 6 according to disclosed embodiments; and FIG. 9 is a block diagram showing a third configuration of the layout of FIG. 6 according to disclosed embodiments.

As shown in FIG. 7, the first through fourth shortable connections 640, 642, 644, 646 and the sixth through ninth shortable connections 650, 652, 654, 656 remain unshorted, while the fifth and tenth shortable connections 648, 658 are shorted.

Under this configuration, the first amplifier path, including the first input matching circuit 602, the first processing circuit 612, and the first output matching circuit 622, as well as the second amplifier path, including the second input matching circuit 604, the second processing circuit 614, and the second output matching circuit 624 operate as described above, amplifying the first RF input signal and the second RF input signal, respectively.

However, the inputs of the third and fourth input matching circuits 606, 608, and the outputs of the third and fourth output matching circuits 626, 628 are grounded. Furthermore, both the third and fourth output matching circuits 626, 628 are isolated from the rest of the circuit. As a result, the third and fourth RF input signals will be grounded, and the third and fourth processed output signals will be a ground signal.

The circuit shown in FIG. 7 corresponds roughly to the embodiment shown in FIG. 3. In operation, the upper amplifier circuit 110 operates to perform a first amplification on the first RF input signal of a first amount at the first processing circuit 612 in a first amplifier path. Likewise, the lower amplifier circuit 115 operates to perform a second amplification on the second RF input signal of the second amount at the second processing circuit 614 in a second amplifier path. The third amplifier path in the lower amplifier circuit 115, and the fourth amplifier path in the upper amplifier circuit 110 are both grounded. If the first and second processing circuits 612, 614 are ×N amplifying circuits, then the embodiment of FIG. 7 provides for two ×N amplifications of an output signals: the first processed output signal would be the first RF input signal amplified by N, and the second processed output signal would be the second RF input signal also amplified by N.

As shown in FIG. 8, the first through fourth shortable connections 640, 642, 644, 646 and the tenth shortable connection 658 remain unshorted, while the fifth through ninth shortable connections 648, 650, 652, 654, 656 are shorted.

Under this configuration, the first amplifier path, including the first input matching circuit 602, the first processing circuit 612, and the first output matching circuit 622, operate as described above, amplifying the first RF input signal.

In the fourth amplifier path, the input of the fourth input matching circuit 608, and the output of the fourth output matching circuit 628 are grounded. Furthermore, the entire fourth output matching circuit 628 is isolated. As a result, the fourth RF input signal will be grounded, and the fourth processed output signal will be a ground signal.

The second amplifier path, including the second input matching circuit 604, the second processing circuit 614, and the second output matching circuit 624, and the third amplifier path, including the third input matching circuit 606, the third processing circuit 616, and the third output matching circuit 626, both operate as described above, amplifying the second RF input signal and the third RF input signal, respectively.

In this implementation, if the same input signal is provided as a second RF input signal and a third RF input signal, the second and third input matching circuits 604, 606 will not properly match the input impedance at the inputs of the second and third processing circuit 614, 616. This is because both the second and third amplifier paths are operating in the lower amplifier circuit 115, and received the same input signal. The disclosed circuit accommodates for this by connecting the second corrective input matching circuit 635 to both the second and third amplifier paths. The second corrective input matching circuit 635 works in conjunction with the second and third input matching circuits 604, 606 to properly match the impedance at the inputs of the second and third processing circuits 614, 616 when a same signal is provided as both a second RF input signal and a third RF input signal.

The circuit of FIG. 8 corresponds roughly to the embodiment shown in FIG. 4. In operation, the upper amplifier 110 operates to perform a first amplification on the first RF input signal of a first amount at the first processing circuit 612 in a first amplifier path. The fourth amplifier path in the upper amplifier 110 is grounded. The lower amplifier 115 operates to perform a second amplification on the second RF input signal of the second amount at the second processing circuit 614 in a second amplifier path, and to perform a third amplification on the third RF input signal of the third amount at the third processing circuit 616 in a third amplifier path. If the first, second and third processing circuit 612, 614, 616 are ×N amplifying circuits, then the embodiment of FIG. 8 provides for ×N amplification to produce three output signals: the first processed output signal would be the first RF input signal amplified by N, the second processed output signal would be the second RF input signal also amplified by N, and the third processed output signal would be the third RF input signal also amplified by N.

If the second and third RF input signals were the same input signal, the second and third processed output signals could then be combined to generate a first combined output signal that was equal to that same input signal amplified by 2N. In this way, the amplifier circuit 100 can provide ×N amplification of the first RF input signal at the first processed output signal, and ×2N amplification of the second/third RF signal at first combined output signal (not shown in FIG. 8).

As shown in FIG. 9, the fifth and the tenth shortable connections 648, 658 remain unshorted, while the first through fourth shortable connections 640, 642, 644, 646 and the sixth through ninth shortable connections 648, 650, 652, 654, 656 are shorted.

Under this configuration, the first amplifier path, including the first input matching circuit 602, the first processing circuit 612, and the first output matching circuit 622, and the fourth amplifier path, including the fourth input matching circuit 608, the fourth processing circuit 618, and the fourth output matching circuit 628, operate to amplify the first RF input signal and the fourth RF input signal, respectively.

Similarly, the second amplifier path, including the second input matching circuit 604, the second processing circuit 614, and the second output matching circuit 624, and the third amplifier path, including the third input matching circuit 606, the third processing circuit 616, and the third output matching circuit 626, operate to amplify the second RF input signal and the third RF input signal, respectively.

However, if the same input signal is provided as a first RF input signal and a fourth RF input signal, the first and fourth input matching circuits 602, 608 will not properly match the input impedance at the inputs of the first and fourth processing circuits 612, 618. The disclosed circuit accommodates for this by connecting the first corrective input matching circuit 630 to both the first and fourth amplifier paths. The first corrective input matching circuit 630 works in conjunction with the first and fourth input matching circuits 602, 608 to properly match the impedance at the inputs of the first and fourth processing circuits 612, 618 when a same signal is provided as both a first RF input signal and a fourth RF input signal.

Likewise, if the same input signal is provided as a second RF input signal and a third RF input signal, the second and third input matching circuits 604, 606 will not properly match the input impedance at the inputs of the second and third processing circuit 614, 616. The disclosed circuit accommodates for this by connecting the second corrective input matching circuit 635 to both the second and third amplifier paths. The second corrective input matching circuit 635 works in conjunction with the second and third input matching circuits 604, 606 to properly match the impedance at the inputs of the second and third processing circuits 614, 616 when a same signal is provided as both a second RF input signal and a third RF input signal.

The circuit of FIG. 9 corresponds roughly to the embodiment shown in FIG. 5. In operation, the upper amplifier 110 operates to perform a first amplification on the first RF input signal of a first amount at the first processing circuit 612 in a first amplifier path, and to perform a fourth amplification on the fourth RF input signal of a fourth amount at the fourth processing circuit 618 in a fourth amplifier path. Likewise, the lower amplifier 115 operates to perform a second amplification on the second RF input signal of the second amount at the second processing circuit 614 in a second amplifier path, and to perform a third amplification on the third RF input signal of the third amount at the third processing circuit 616 in a third amplifier path. If the first, second, third, and fourth processing circuit 612, 614, 616, 618 are ×N amplifying circuits, then the embodiment of FIG. 9 provides for ×N amplification to produce four output signals: the first processed output signal would be the first RF input signal amplified by N, the second processed output signal would be the second RF input signal also amplified by N, the third processed output signal would be the third RF input signal also amplified by N, and the fourth processed output signal would be the fourth RF input signal also amplified by N.

If the second and third RF input signals are both a first common input signal, the second and third processed output signals can be combined to generate a first combined output signal that is equal to that first common input signal amplified by 2N. Likewise, if the first and fourth RF input signals are both a second common input signal, the first and fourth processed output signals can be combined to generate a second combined output signal that is equal to the second common input signal amplified by 2N. In this way, the amplifier circuit 100 can provide ×2N amplification of the first common input signal (i.e., the second and third RF signal) at a first combined output signal (not shown), and ×2N amplification of the second common input signal (i.e., the first and fourth RF input signals) at a second combined output signal (not shown in FIG. 9).

Thus, as shown by FIGS. 3-9, the same manufactured circuit (i.e., the circuit shown in FIG. 6) can be used to create multiple amplifier implementations, each having different amplification paths. For example, as shown in the exemplary embodiments above, if each of the amplifier paths serves to amplify by N, then there are three possible implementations that can be achieved with this single manufactured circuit. In particular, as shown in FIG. 7, a ×N/×N amplifier can be implemented; as shown in FIG. 8, a ×N/×2N amplifier can be implemented; and as shown in FIG. 9, a ×2N/×2N amplifier can be implemented. Numerous other possible combinations of amplification configurations will be apparent to those of skill in the art.

Although in FIGS. 6-9 a constant amplification of ×N is described for each application path, this is by way of example only. In different embodiments, the amplification provided in each of the first through fourth processing circuits 612, 614, 616, 618 can be varied as needed for any given amplifier implementation.

Figure 10:
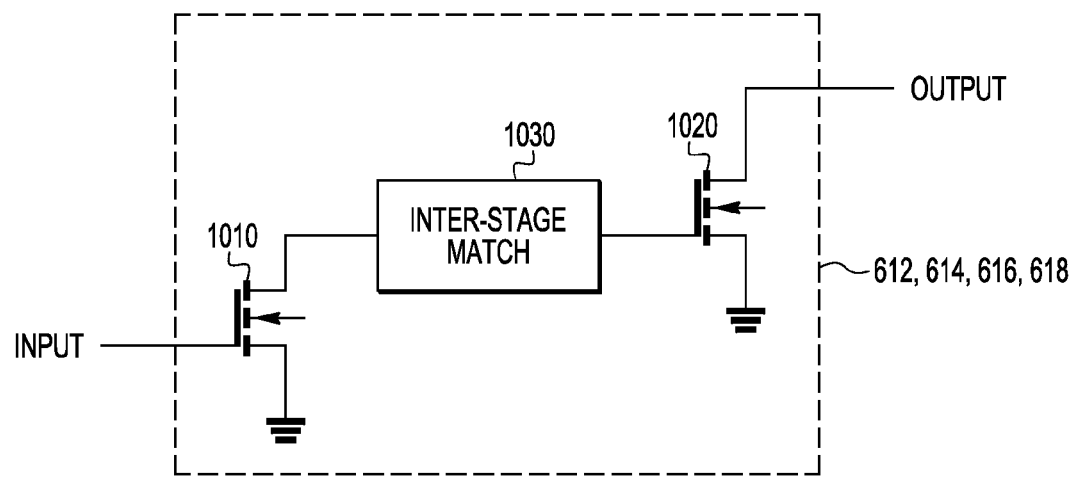
FIG. 10 is a block diagram of a processing circuit of FIGS. 6-9 according to disclosed embodiments.

FIG. 10 is a block diagram of a processing circuit 612, 614, 616, 618 of FIGS. 6-9 according to disclosed embodiments. As shown in FIG. 10, the processing circuit 612, 614, 616, 618 can include an input transistor 1010 and an output transistor 1020, connected by an inter-stage impedance matching circuit 1030.

The input and output transistors 1010, 1020 operate to amplify the input signal and to provide an amplified output signal.

The inter-stage impedance matching circuit 1030 operates to provide impedance matching between these two transistors 1010, 1020.

Method of Operation

Figure 11:
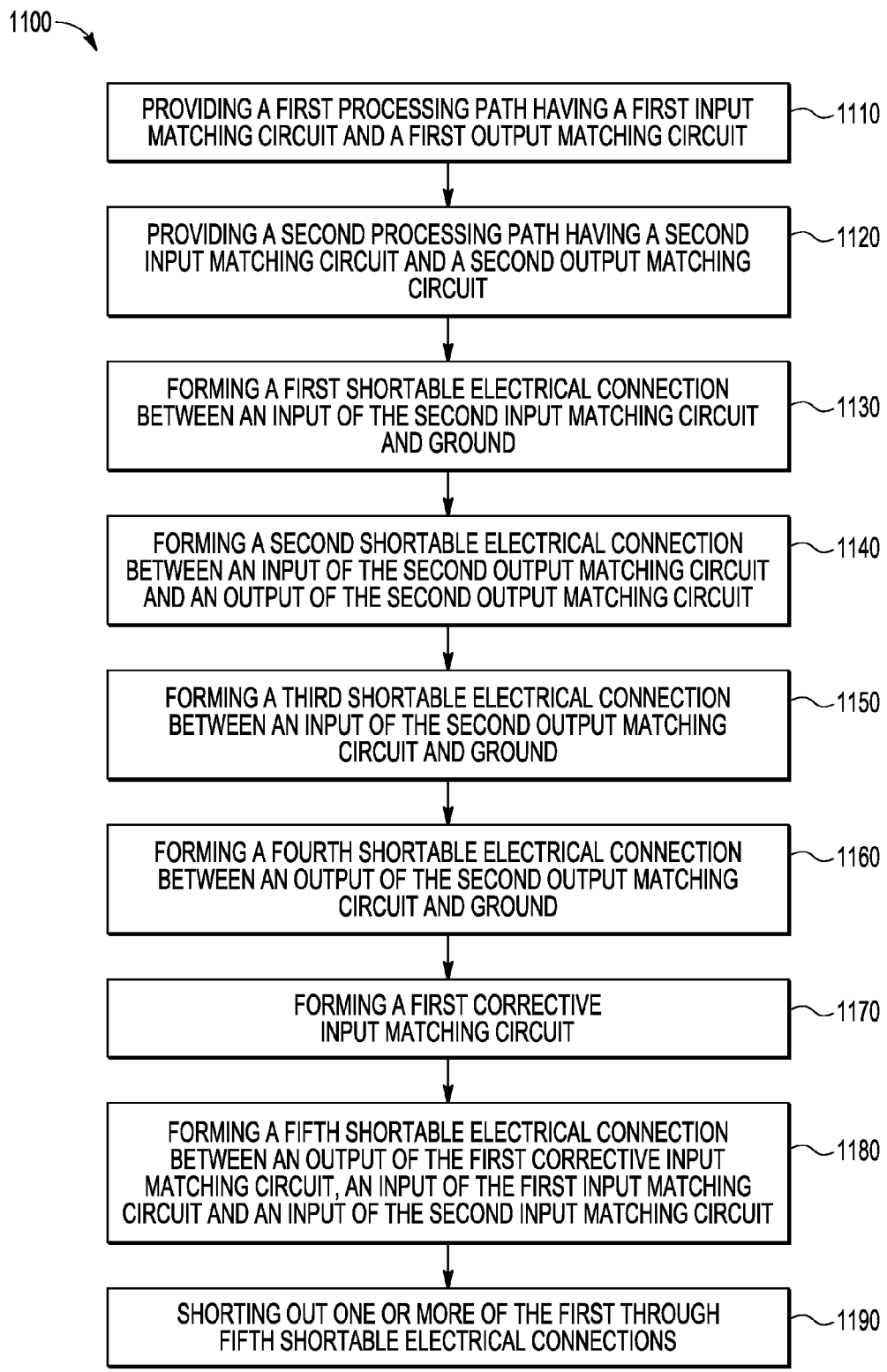
FIG. 11 is a flow chart of a manufacturing process of a configurable amplifier circuit according to disclosed embodiments.

FIG. 11 is a flow chart of a manufacturing process 1100 of a configurable amplifier circuit according to disclosed embodiments.

As shown in FIG. 11, the process 1100 begins by providing a first processing path having a first input matching circuit and a first output matching circuit on a single die (1110), and providing a second processing path having a second input matching circuit and a second output matching circuit on the single die (1120).

Four shortable electrical connections are then formed within the circuits provided in the first and second processing paths. A first shortable electrical connection is formed between an input of the second input matching circuit and ground (1130); a second shortable electrical connection is formed between an input of the second output matching circuit and an output of the second output matching circuit (1140); a third shortable electrical connection is then formed between an input of the second output matching circuit and ground (1150); and a fourth shortable connection is formed between an output of the second output matching circuit and ground (1160).

A first corrective input matching circuit is then formed between the first processing path and the second processing path (1170).

A fifth shortable electrical connection is then formed between an output of the first corrective input matching circuit, an input of the first input matching circuit, and an input of the second input matching circuit (1180).

After these circuits and shortable electrical connections are formed, one or more of the first through fifth shortable electrical connections are then shorted out. This can be done, for example, through the use of a laser melting the relevant shortable electrical connections.

In one disclosed embodiment, only the fifth shortable article connection is shorted, while the first through fourth shortable connections are left unshorted. In another disclosed embodiment, the first through fourth shortable electrical connections are shorted, while the fifth shortable electrical connection is left unshorted.

In various embodiments, the disclosed processing steps can be repeated for a second or more amplifier circuits on the same single die.

General Description

A multiple-path, configurable, radio-frequency (RF) circuit, including: a first processing path including a first input matching circuit configured to provide a first base impedance-matched input signal based on a first RF input signal received at an input of the first input matching circuit, a first processing circuit configured to perform a first electrical process on the first base impedance-match input signal to generate a first processed signal, and a first output matching circuit configured to provide a first impedance-matched output signal based on the first processed signal; a second processing path including a second input matching circuit configured to provide a second base impedance matching for a second RF input signal received at an input of the second input matching circuit, a first shortable electrical connection formed between the input of the second input-matching circuit and ground, a second processing circuit configured to perform a second electrical process on the second base impedance-match input signal to generate a second processed signal, a second output matching circuit configured to provide a second impedance-matched output signal based on the second processed signal, a second shortable electrical connection formed between an input of the second output matching circuit and an output of the second output matching circuit, a third shortable electrical connection formed between the input of the second output matching circuit and ground, and a fourth shortable electrical connection formed between the output of the second output matching circuit and ground, a first corrective input matching circuit configured to change first impedance-matching properties of the first input matching circuit, and to change second impedance-matching properties of the second input matching circuit; and a fifth shortable electrical connection formed between an output of the first corrective input matching circuit, the input of the first input matching circuit, and the input of the second input matching circuit.

The first and second processing paths may both be amplifying paths, the first processing circuit may be a first amplifying circuit, and the second processing circuit may be a second amplifying circuit.

The first through fifth shortable electrical connections may all be low-inductance wirebond jumpers.

The first and second processing paths may both be formed on the same die.

The multiple-path, configurable, radio-frequency RF circuit may further include: shorting the fifth shortable electrical connection.

The multiple-path, configurable, radio-frequency RF circuit may further include: shorting the first through fourth shortable electrical connections.

The multiple-path, configurable, radio-frequency RF circuit may further include: a third processing path including a third input matching circuit configured to provide a third base impedance-matched input signal based on a third RF input signal received at an input of the third input matching circuit, a third processing circuit configured to perform a third electrical process on the third base impedance-match input signal to generate a third processed signal, and a third output matching circuit configured to provide a third impedance-matched output signal based on the third processed signal; a fourth processing path including a fourth input matching circuit configured to provide a fourth base impedance matching for a fourth RF input signal received at an input of the fourth input matching circuit, a sixth shortable electrical connection formed between the input of the fourth input-matching and ground, a fourth processing circuit configured to perform a fourth electrical process on the fourth base impedance-match input signal to generate a fourth processed signal, a fourth output matching circuit configured to provide a fourth impedance-matched output signal based on the fourth processed signal, a seventh shortable electrical connection formed between an input of the fourth output matching circuit and an output of the fourth output matching circuit, a eighth shortable electrical connection formed between the input of the fourth output matching circuit and ground, and a ninth shortable electrical connection formed between the output of the fourth output matching circuit and ground, a second corrective input matching circuit configured to change third impedance-matching properties of the third input matching circuit, and to change fourth impedance-matching properties of the fourth input matching circuit; and a tenth shortable electrical connection formed between an output of the second corrective input matching circuit, the input of the third input matching circuit, and the input of the fourth input matching circuit.

The third and fourth processing paths may both be amplifying paths, the third processing circuit may be a third amplifying circuit, and the fourth processing circuit may be a fourth amplifying circuit.

The sixth through tenth shortable electrical connections may all be low-inductance wirebond jumpers.

The first, second, third, and fourth processing paths may all be formed on the same die.

The multiple-path, configurable, radio-frequency RF circuit may further include: a grounding element formed between the first and second processing paths and the third and fourth processing paths.

The grounding element may be a ground fence region.

The multiple-path, configurable, radio-frequency RF circuit may further include: shorting the fifth and tenth shortable electrical connection.

The multiple-path, configurable, radio-frequency RF circuit may further include: shorting the first through fourth shortable electrical connections; and shorting the sixth through ninth shortable electrical connections.

The multiple-path, configurable, radio-frequency RF circuit may further include: shorting the fifth shortable electrical connection; and shorting the sixth through ninth shortable electrical connections.

A multiple-path, configurable, radio-frequency (RF) circuit, including: a first amplifier path configured to match a first input impedance of a first RF input signal to generate a first input-impedance-matched signal, amplify the first input-impedance-matched signal by a first amplification factor to generate a first amplified signal, and match a first output impedance of the first amplified signal to generate a first output-impedance-matched signal; a second amplifier path configured to match a second input impedance of a second RF input signal to generate a second input-impedance-matched signal, amplify the second input-impedance-matched signal by a second amplification factor to generate a second amplified signal, and match a second output impedance of the second amplified signal to generate a second output-impedance-matched signal; a first corrective input matching circuit, configured to change first input-impedance-matching properties of the first amplifier path, and to change second input-impedance-matching properties of the second amplifier path; a first isolation element configured to selectively ground an input node of the second amplifier path; a second isolation element configured to selectively isolate an output node of the second amplifier path; and a third isolation element connected between the first corrective input matching circuit and first and second input nodes of the first and second amplifier paths, respectively, configured to selectively isolate the first corrective input matching circuit from the first and second input nodes or connect the first corrective input matching circuit to the first and second input nodes.

The first through third isolation elements may all include shortable electrical connections.

The first through third isolation elements may all include low-inductance wirebond jumpers.

The first and second amplifying paths may both be formed on the same die.

A method of manufacturing a multiple-path, configurable, radio-frequency (RF) circuit, including: providing a first processing path that includes a first input matching circuit, a first processing circuit, and a first output matching circuit connected in series; forming a second processing path that includes a second input matching circuit, a second processing circuit, and a second output matching circuit connected in series; forming a first shortable electrical connection between an input of the second input-matching circuit and ground; forming a second shortable electrical connection between an input of the second output matching circuit and an output of the second output matching circuit; forming a third shortable electrical connection between the input of the second output matching circuit and ground; forming a fourth shortable electrical connection between the output of the second output matching circuit and ground, forming a first corrective input matching circuit configured to change first impedance-matching properties of the first input matching circuit, and to change second impedance-matching properties of the second input matching circuit; and forming a fifth shortable electrical connection between an output of the first corrective input matching circuit, the input of the first input matching circuit, and the input of the second input matching circuit.

The first and second processing paths may both be amplifying paths, the first processing circuit may be a first amplifying circuit, and the second processing circuit may be a second amplifying circuit.

The first through fifth shortable electrical connections may all be low-inductance wirebond jumpers.

The first and second processing paths may both be formed on the same die.

The method may further include: forming a third processing path that includes a third input matching circuit, a third processing circuit, and a third output matching circuit connected in series; forming a fourth processing path that includes a fourth input matching circuit, a fourth processing circuit, and a fourth output matching circuit in series; forming a sixth shortable electrical connection between an input of the fourth input-matching and ground; forming a seventh shortable electrical connection between an input of the fourth output matching circuit and an output of the fourth output matching circuit; forming a eighth shortable electrical connection between the input of the fourth output matching circuit and ground; forming a ninth shortable electrical connection between the output of the fourth output matching circuit and ground; forming a second corrective input matching circuit configured to change third impedance-matching properties of the third input matching circuit, and to change fourth impedance-matching properties of the fourth input matching circuit; and forming a tenth shortable electrical connection between an output of the second corrective input matching circuit, the input of the third input matching circuit, and the input of the fourth input matching circuit.

The third and fourth processing paths may both be amplifying paths, the third processing circuit may be a third amplifying circuit, and the fourth processing circuit may be a fourth amplifying circuit.

The sixth through tenth shortable electrical connections may all be low-inductance wirebond jumpers.

The first, second, third, and fourth processing paths may all be formed on the same die.

The method may further include: forming a grounding element formed the first and second processing paths and the third and fourth processing paths.

The grounding element may be a ground fence region.

The multiple-path, configurable, radio-frequency RF circuit may further include: shorting out the fifth shortable electrical connection.

The multiple-path, configurable, radio-frequency RF circuit may further include: shorting out the first, second, third, and fourth shortable electrical connections.

Conclusion

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A multiple-path, configurable, radio-frequency (RF) circuit, comprising:
    a first amplifier path configured to match a first input impedance of a first RF input signal to generate a first input-impedance-matched signal, amplify the first input-impedance-matched signal by a first amplification factor to generate a first amplified signal, and match a first output impedance of the first amplified signal to generate a first output-impedance-matched signal;
    a second amplifier path configured to match a second input impedance of a second RF input signal to generate a second input-impedance-matched signal, amplify the second input-impedance-matched signal by a second amplification factor to generate a second amplified signal, and match a second output impedance of the second amplified signal to generate a second output-impedance-matched signal;
    a first corrective input matching circuit, configured to change first input-impedance-matching properties of the first amplifier path, and to change second input-impedance-matching properties of the second amplifier path;
    a first isolation element configured to selectively ground an input node of the second amplifier path;
    a second isolation element configured to selectively isolate an output node of the second amplifier path; and
    a third isolation element connected between the first corrective input matching circuit and first and second input nodes of the first and second amplifier paths, respectively, configured to selectively isolate the first corrective input matching circuit from the first and second input nodes or connect the first corrective input matching circuit to the first and second input nodes.

2. The multiple-path, configurable, radio-frequency RF circuit of claim 1, wherein the first through third isolation elements all comprise shortable electrical connections.

3. The multiple-path, configurable, radio-frequency RF circuit of claim 1, wherein the first through third isolation elements all comprise low-inductance wirebond jumpers.

4. The multiple-path, configurable, radio-frequency RF circuit of claim 1, wherein the first and second amplifying paths are both formed on the same die.

5. A multiple-path, configurable, radio-frequency (RF) circuit, comprising:
    a first processing path including
        a first input matching circuit configured to provide a first base impedance-matched input signal based on a first RF input signal received at an input of the first input matching circuit,
        a first processing circuit configured to perform a first electrical process on the first base impedance-match input signal to generate a first processed signal, and
        a first output matching circuit configured to provide a first impedance-matched output signal based on the first processed signal;
    a second processing path including
        a second input matching circuit configured to provide a second base impedance matching for a second RF input signal received at an input of the second input matching circuit,
        a first shortable electrical connection formed between the input of the second input-matching circuit and ground,
        a second processing circuit configured to perform a second electrical process on the second base impedance-match input signal to generate a second processed signal,
        a second output matching circuit configured to provide a second impedance-matched output signal based on the second processed signal,
        a second shortable electrical connection formed between an input of the second output matching circuit and an output of the second output matching circuit,
        a third shortable electrical connection formed between the input of the second output matching circuit and ground, and
        a fourth shortable electrical connection formed between the output of the second output matching circuit and ground,
    a first corrective input matching circuit configured to change first impedance-matching properties of the first input matching circuit, and to change second impedance-matching properties of the second input matching circuit; and
    a fifth shortable electrical connection formed between an output of the first corrective input matching circuit, the input of the first input matching circuit, and the input of the second input matching circuit.

6. The multiple-path, configurable, radio-frequency RF circuit of claim 5, wherein
    the first and second processing paths are both amplifying paths,
    the first processing circuit is a first amplifying circuit, and the second processing circuit is a second amplifying circuit.

7. The multiple-path, configurable, radio-frequency RF circuit of claim 5, wherein the first through fifth shortable electrical connections are all low-inductance wirebond jumpers.

8. The multiple-path, configurable, radio-frequency RF circuit of claim 5, wherein the first and second processing paths are both formed on the same die.

9. The multiple-path, configurable, radio-frequency RF circuit of claim 5, further comprising:
    a third processing path including a third input matching circuit configured to provide a third base impedance-matched input signal based on a third RF input signal received at an input of the third input matching circuit, a third processing circuit configured to perform a third electrical process on the third base impedance-match input signal to generate a third processed signal, and a third output matching circuit configured to provide a third impedance-matched output signal based on the third processed signal;

a fourth processing path including a fourth input matching circuit configured to provide a fourth base impedance matching for a fourth RF input signal received at an input of the fourth input matching circuit, a sixth shortable electrical connection formed between the input of the fourth input-matching and ground, a fourth processing circuit configured to perform a fourth electrical process on the fourth base impedance-match input signal to generate a fourth processed signal, a fourth output matching circuit configured to provide a fourth impedance-matched output signal based on the fourth processed signal, a seventh shortable electrical connection formed between an input of the fourth output matching circuit and an output of the fourth output matching circuit, a eighth shortable electrical connection formed between the input of the fourth output matching circuit and ground, and a ninth shortable electrical connection formed between the output of the fourth output matching circuit and ground, a second corrective input matching circuit configured to change third impedance-matching properties of the third input matching circuit, and to change fourth impedance-matching properties of the fourth input matching circuit; and a tenth shortable electrical connection formed between an output of the second corrective input matching circuit, the input of the third input matching circuit, and the input of the fourth input matching circuit.

10. The multiple-path, configurable, radio-frequency RF circuit of claim 9, wherein
the third and fourth processing paths are both amplifying paths,
the third processing circuit is a third amplifying circuit, and the fourth processing circuit is a fourth amplifying circuit.

11. The multiple-path, configurable, radio-frequency RF circuit of claim 9, wherein the sixth through tenth shortable electrical connections are all low-inductance wirebond jumpers.

12. The multiple-path, configurable, radio-frequency RF circuit of claim 9, wherein the first, second, third, and fourth processing paths are all formed on the same die.

13. The multiple-path, configurable, radio-frequency RF circuit of claim 9, further comprising:
a grounding element formed between the first and second processing paths and the third and fourth processing paths.

14. The multiple-path, configurable, radio-frequency RF circuit of claim 13, wherein the grounding element is a ground fence region.

15. A method of manufacturing a multiple-path, configurable, radio-frequency (RF) circuit, comprising:
providing a first processing path that includes a first input matching circuit, a first processing circuit, and a first output matching circuit connected in series;
forming a second processing path that includes a second input matching circuit, a second processing circuit, and a second output matching circuit connected in series;
forming a first shortable electrical connection between an input of the second input-matching circuit and ground;
forming a second shortable electrical connection between an input of the second output matching circuit and an output of the second output matching circuit;
forming a third shortable electrical connection between the input of the second output matching circuit and ground;
forming a fourth shortable electrical connection between the output of the second output matching circuit and ground,
forming a first corrective input matching circuit configured to change first impedance-matching properties of the first input matching circuit, and to change second impedance-matching properties of the second input matching circuit; and
forming a fifth shortable electrical connection between an output of the first corrective input matching circuit, the input of the first input matching circuit, and the input of the second input matching circuit.

16. The method of manufacturing a multiple-path, configurable, radio-frequency RF circuit of claim 15, wherein
the first and second processing paths are both amplifying paths,
the first processing circuit is a first amplifying circuit, and the second processing circuit is a second amplifying circuit.

17. The method of claim 15, wherein the first through fifth shortable electrical connections are all low-inductance wirebond jumpers.

18. The method of claim 15, wherein the first and second processing paths are both formed on the same die.

19. The method of claim 15, further comprising:
shorting out the fifth shortable electrical connection.

20. The method of claim 15, further comprising:
shorting out the first, second, third, and fourth shortable electrical connections.

* * * * *